METHOD OF MAKING PASSIVATED SEMICONDUCTOR DEVICES

Filed Aug. 7, 1964 2 Sheets-Sheet 1

INVENTORS
ERIC F. CAVE &
ALFRED MAYER
BY
W.S. Hill
Agent

METHOD OF MAKING PASSIVATED SEMICONDUCTOR DEVICES

Filed Aug. 7, 1964 2 Sheets-Sheet 2

INVENTORS
ERIC F. CAVE &
BY ALFRED MAYER
W.S. Hill
Agent

United States Patent Office 3,369,290

Patented Feb. 20, 1968

3,369,290

METHOD OF MAKING PASSIVATED SEMICONDUCTOR DEVICES

Alfred Mayer, Plainfield, and Eric F. Cave, Somerville, N.J., assignors to Radio Corporation of America, a corporation of Delaware Filed Aug. 7, 1964, Ser. No. 388,237
4 Claims. (Cl. 29—581)

This invention relates generally to semiconductor devices, and more particularly to an improved method of making passivated semiconductor devices. The improved method of the present invention is especially useful for making passivated, mesa-type power rectifiers by mass production. While the present invention will be described, for illustrative purposes, by an improved method of making passivated rectifiers, many other types of semiconductor devices can also be made by this improved method.

Many semiconductor devices, such as power rectifiers, for example, are passivated, by enclosing them in hermetically sealed headers and cases. In many instances, the semiconductor device is protected against ambient moisture, dust and other contaminants by embedding it in an insulating or sealing medium. While such prior art techniques of passivating semiconductor devices are suitable for many types of devices, these techniques are sometimes difficult to apply when the semiconductor device is very small and relatively fragile. In some semiconductor devices, it is also difficult to identify the different electrode regions of the devices during the manufacturing process and prior to the embedding operation without time-consuming testing.

It is an object of the present invention to provide an improved method of passivating semiconductor devices so that their performance is not influenced by ambient gas, moisture, or chemical impurities.

Another object of the present invention is to provide an improved method of making semiconductor devices wherein the electrode regions of the semiconductor devices are indexed and identifiable during the method of manufacture, thereby eliminating the need for testing and sorting these devices to identify their respective electrode regions.

Still another object of the present invention is to provide an improved method of making semiconductor devices wherein a plurality of these devices can be passivated simultaneously by mass production.

A further object of the present invention is to provide an improved method of making passivated semiconductor devices of relatively low cost and high quality performance.

The improved method of making passivated semiconductor devices of the present invention will be described in connection with the manufacture of mesa-type, power rectifiers. In one embodiment of the present invention, two wafers of semiconductor material, such as silicon, for example, are joined to each other, as by hot pressing, with the aid of a fusible metal between them to form a block. One wafer, the junction wafer, is formed with a PN junction substantially parallel to its opposed major surfaces, and the other wafer, hereinafter called the substrate and functioning as a substantially rigid support, is metallized to provide a good ohmic contact. After the joining, a plurality of grooves are cut in the block. Each of the grooves extends through the junction wafer to a region within the substrate, thereby forming a plurality of mesas. The exposed surfaces of the wafer, including those portions of the wafer and the substrate that define the grooves, are coated with an insulating material, preferably by oxidizing the silicon to form a layer of silicon dioxide thereon. Insulating material, such as softened glass is now pressed into the grooves, and, when cooled, the opposed major surfaces of the block are lapped to expose the mesa surfaces in the junction wafer and to expose a conductive major surface of the substrate. The latter exposed surfaces are metallized and a plurality of electrodes are fused to them. By cutting through the glass in each groove, a plurality of similar semiconductor devices, such as power rectifiers described herein, are separated from each other, each rectifier being passivated by a sheath of electrical insulation, glass.

The novel features of the present invention, both as to its organization and performance, as well as additional objects and advantages thereof, will be more readily understood from the following description, when read in connection with the accompanying drawings, in which similar reference characters represent similar parts thoughout, and in which.

Figure 1:
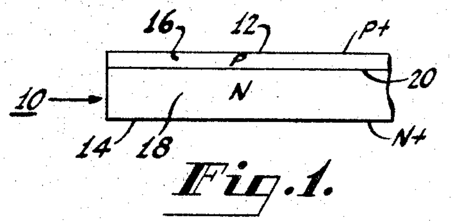
FIG. 1 is a fragmentary, front-elevational view of a wafer of semiconductor material used in the method of making passivated semiconductor devices in accordance with the present invention.

Referring, now, particularly to FIG. 1 of the drawings, there is shown a portion of a side-elevational view of a wafer 10 of single crystal, semiconductor material, such as silicon, germanium, or gallium arsenide, for example. The wafer 10 may be one inch square with a thickness of between 4 and 12 mils having, as viewed in FIG. 1, upper and lower opposed major surfaces 12 and 14, respectively. The descriptive terms "upper and lower," for example, are merely relative and are used herein merely for ease of description and not in a limiting sense. Acceptor and donor impurities may be diffused through the opposed surfaces 12 and 14 of the wafer 10, as by any double diffusion method known in the art, to form P-type and N-type zones 16 and 18, respectively, therein. This double diffusion can be controlled by means known in the art so that the P-type zone 16 extends inwardly from the surface 12 to a depth of about 2 mils, forming a PN junction 20 with the N-type zone 18. The PN junction 20 now comprises a plane that is substantially parallel to the opposed surfaces 12 and 14 of the wafer 10. As a result of the diffusion, the opposed surfaces 12 and 14 may be of relatively high electrical conductivity.

Instead of the aforementioned double diffusion method, the PN junction can be formed by single diffusion steps. Also, the wafer 10 may be substantially N-type semiconductor material into which a P-type impurity is diffused to form the PN junction 20.

The wafer 10 is fixed to a suitable substrate to facilitate handling and treatment of the fragile wafer. Thus, the wafer 10 is fixed to a suitable substrate 22, such as a highly doped P-type wafer of silicon which can also become a portion of the finished semiconductor device. The wafer 10 and the substrate 22 should be of material having substantially the same thermal coefficient of expansion to provide a structurally stable finished product.

Figure 2:
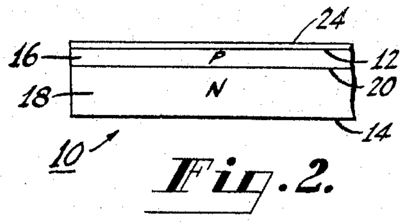
FIG. 2 is a fragmentary view of the wafer illustrated in FIG. 1, showing a step in the method of the present invention.

The junction wafer 10 and the substrate 22 may be joined together by the operation of hot pressing. If the abutting surfaces of the wafer 10 and the substrate 22 are etched, it is preferable to coat one of the abutting surfaces with a layer 24 of a metal, such as chromium, nickel, tantalum, tungsten, niobium, magnesium, silver, cobalt, copper, or titanium, for example. Thus, the layer 24 of metal may be applied to the surface 12 of the wafer 10, as shown in FIG. 2, either by the process of evaporation or by plating or by dipping the wafer in a fine powder of the metal or by inserting a thin metal foil between wafer and substrate. The thickness of the layers herein have been exaggerated in the drawing for the sake of clarity. The thickness of the layer 24 of metal is between 1,000 and 100,000 A.

Figure 3:
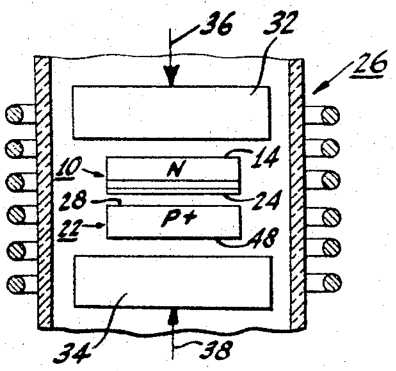
FIG. 3 is a fragmentary, cross-sectional view of a portion of an induction furnace, showing an exploded, reduced view of portions of a wafer and a substrate in a step in the method of the present invention.
Figure 4:
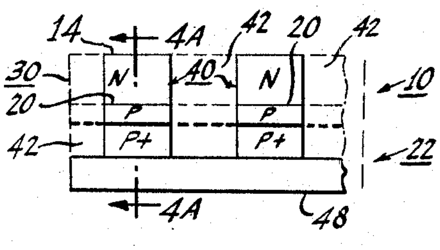
FIG. 4 is a fragmentary, front-elevational view of a wafer and a substrate fixed to each other to form a block, showing grooves cut therein in accordance with a step in the method of the present invention, the dashed lines of the figure representing portions of the block that are cut away to form the grooves.

The hot pressing of the wafer 10 to the substrate 22 may be carried out under pressure in an induction furnace 26, as shown in exploded view in FIG. 3. The layer 24 of metal on the wafer 10 is disposed against the adjacent surface 28 of the substrate 22 to form a block 30 (FIG. 4). The wafer 10 and the substrate 22 are inserted between two carbon plates 32 and 34 so that pressure in the direction indicated by the arrows 36 and 38, can be applied to opposite sides, while sufficient heat is supplied by the induction furnace 26 to fuse the metal layer 24 so as to join the wafers 10 and 22 into the block 30. Where the layer 24 is of chrominum or titanium, the hot pressing of the silicon wafer 10 to the substrate 22 can be carried out at a temperature between 950° C. and 1400° C. and at a pressure of between 200 and 5,000 p.s.i. The hot pressing should be done in a vacuum or in a neutral or reducing atmosphere, such as argon or hydrogen, for example. Lower temperatures and pressures can be used for germanium or the III–V semiconductor materials, as, for example, gallium arsenide.

Figure 4A:
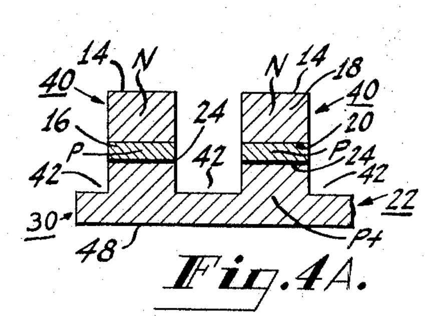
FIG. 4A is a fragmentary, cross-sectional view of the grooved block taken along the line 4A in FIG. 4 and viewed in the direction indicated by the arrows.
Figure 4B:
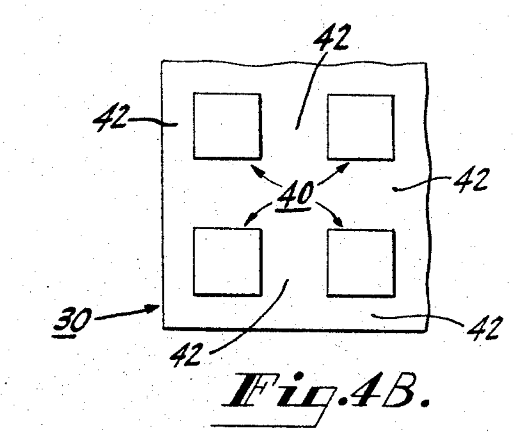
FIG. 4B is a fragmentary, plan view of the grooved block illustrated in FIG. 4.
Figure 5:
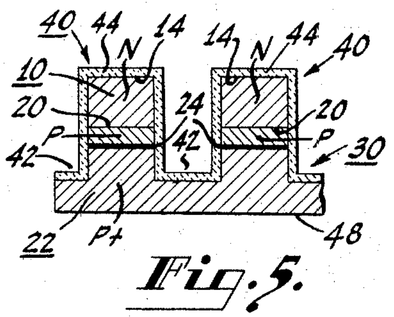
FIGS. 5, 6 and 7 are fragmentary, cross-sectional views, similar to that of FIG. 4A, showing different steps in the method of the present invention.
Figure 6:
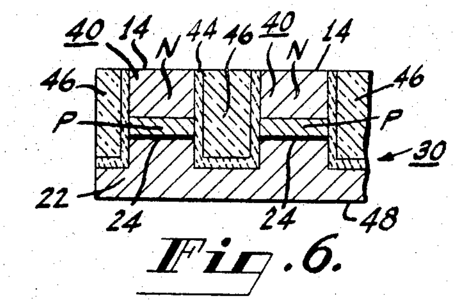

After the block 30 is formed, a plurality of mesas 40 are formed in the block 30 by cutting a plurality of grooves 42 therein, as shown in FIGS. 4, 4A, and 4B. The dashed lines in the block 30 in FIG. 4 illustrate portions of the block 30 before the grooves 42 are formed therein. Each of the grooves 42 extends completely through the wafer 10 and partially through the substrate 22 to form a plurality of substantially similar mesas 40 in a substantially regular pattern, as shown in the plan view of FIG. 4B. The grooves 42 may be cut in the block 30 by chemical or electrolytic etching, sand blasting, sawing, grinding, or ultrasonic machining (cavitroning), for example.

It is desired to press softened glass into the grooves 42, but, since most glasses contain impurities that may adversely affect the PN junction 20, it is desirable to coat the upper surface 14 of the mesas and those portions of the wafer 10 and the substrate 22 that define the grooves 42 with a layer 44 of electrically inert material, such as silicon dioxide, for example. The layer 44 of silicon dioxide can be deposited on the upper surface of the grooved block 30 by any means known in the art, as by direct oxidation, or by the evaporation of silicon dioxide ($SiO_2$) or SiO in $O_2$, by the vapor phase decomposition of organosilanes, or by the hydrolysis or oxidation of silicon halides, for example. The $SiO_2$ may be modified with other oxides, such as phosphosilicate, borosilicate, or lead silicate, for example, where the wafer 10 is gallium arsenide or germanium. If a glass of high purity (inert to the wafers) is available, the layer 44 may be omitted. The thickness of the layer 44 is preferable between 3,000 and 10,000 A.

Glass 46, heated to the softening point, may now be pressed into the grooves 42. The induction heating furnace 26, shown in FIG. 3, may be used to soften the glass 46. Pressure may be applied between the glass 46 and the substrate 22 by placing a sheet of glass 46 on the surface 14 of the coated mesas 40 and pressing the assembly between the blocks 32 and 34 with a pressure of between 200 and 5,000 p.s.i., the temperature of the glass being sufficient to cause it to soften. Although the deposition of the glass 46 into the grooves 42 is easily accomplished by the step of hot pressing, as described, other means of depositing the glass, such as by sedimentation, fusion, or vapor deposition, may also be employed. Several types of glass 46 that have good thermal expansion characteristics for use with silicon are commercially available. For example, Corning #7070, 7740, or 1715, Owens-Illinois glass #KG33, ES1, EE5, EE4, and Pemco experimental glass #QJ5 may be used with silicon wafers 10. Corning glass #7520 or Owens-Illinois #N10 may be used satisfactorily when the wafer 10 is of germanium or gallium arsenide.

In general, suitable glasses for use in the present invention should posses a relatively high electrical resistance and should be free from chemicals that may dope the semiconductor material adversely, in addition to having substantially the same thermal coefficient of expansion as the semiconductor material. In the aforementioned examples of suitable glasses, Owens-Illinois #EE5 glass is an alumina silicate glass, free from alkali and boron, Corning #1715 glass is a calcium aluminum silicate, and Pemco #QJ5 glass is a magnesium alumina silicate.

When the glass 46 has cooled, the opposed major surfaces of the block 30 are lapped to expose the clean remote outer semiconductor surfaces 14 of the mesas 40 and the outer major surfaces 48 of the substrate 22.

The cleaned semiconductor surfaces 14 of the mesas 40 and the outer major surface 48 of the substrate 22 are now plated with a layer 50 of a metal, such as electroless nickel, and then dipped in molten solder to form a layer 52 of solder over the layer 50. The layers 50 and 52 provide convenient means for applying electrodes. Metals, brazes, and alloys, other than those mentioned for the layer 50, may also be used.

Figure 8:
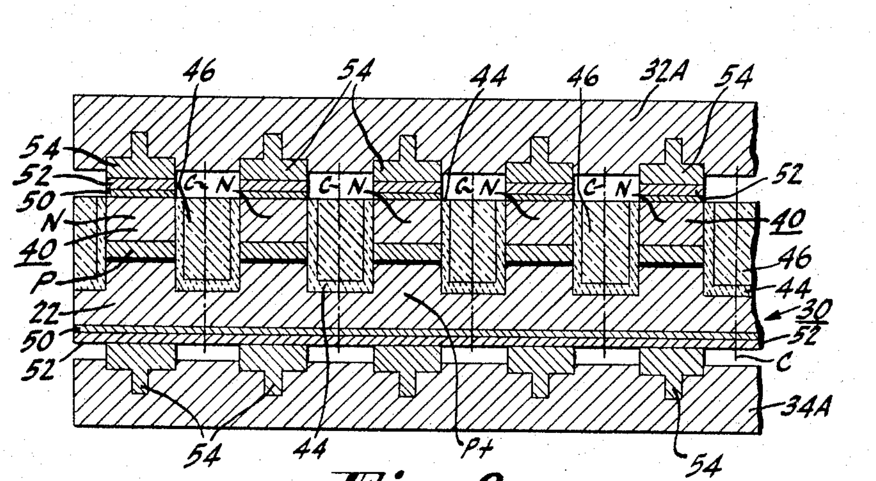
FIG. 8 is a fragmentary, cross-sectional view similar to that of FIG. 7 but showing more mesas and illustrating the method of fixing external electrodes simultaneously to a plurality of rectifiers in a step in the method of the present invention.

A plurality of electrodes, such as copper studs 54, can now be applied to the layers 52 of solder simultaneously. The studs 54 are disposed in carbon jigs 32A and 34A in a manner whereby a separate stud 54 can be positioned over a respective layer 54 of solder on each mesa 40, and a separate stud 54 can be in contact with the layer 54 on the substrate 22 directly beneath each mesa 40. The assembly of jigs 32A, 34A, and the block 30, as shown in FIG. 8, is heated, as by the induction furnace 26, to solder the studs 54 in place. The jigs 32A and 34A are now removed, and the block 30 is cut, along the planes C indicated in FIG. 8, to separate the individual semiconductor devices, rectifiers herein, from each other.

Figure 9:
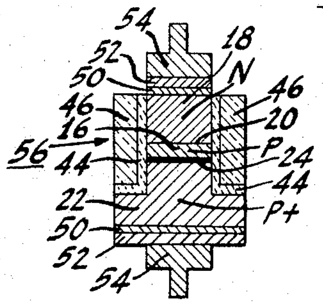
FIG. 9 is a cross-sectional view of a passivated rectifier cut from the block illustrated in FIG. 8.

The cross-section of a separated passivated rectifier 56 is shown in FIG. 9. The cutting is preferably along a plane perpendicular to major surfaces of the wafer 10 and through the glass 46. The cutting operation may be carried out by etching, sand blasting, ultrasonic machining, scribing, and the like. It will be seen that the PN junction 20 and the P-type and N-type zones 16 and 18, respectively, of the rectifier 56 are surrounded by a sheath of passivating glass 46.

Figure 7:
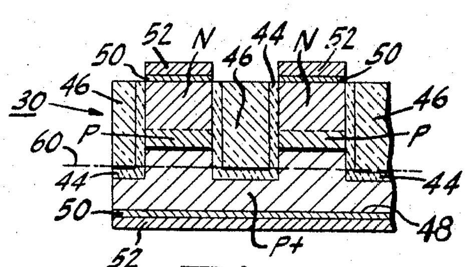
Figure 10:
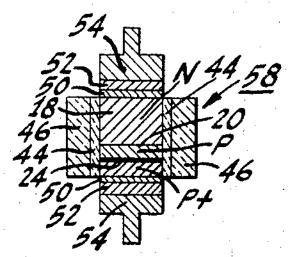
FIG. 10 is a cross-sectional view of another embodiment of a passivated rectifier made by the method of the present invention.

Another embodiment of a rectifier 58 made in accordance with the method of the present invention is shown in FIG. 10. The rectifier 58 is made by lapping the outer major (lower) surface of the block 30 to the plane 60 illustrated in FIG. 7 and following through with the operations described for the rectifier 56. The plane 60 extends to or beyond the glass 46. Thus, the glass 46 forms a complete passivating sheath around the semiconductor material employed in the rectifier 58, except for the electrode contact areas.

From the foregoing description, it will be apparent that there has been provided an improved method of making semiconductor devices by mass production. While the improved method of the present invention has been described with respect to making rectifiers, other semiconductor devices, such as mesa transistors, silicon controlled rectifiers, and Zener diodes, for example, may also be made by this method. Also, while some variations in the steps of the present invention have been described, other variations in these operations, all coming within the spirit of this invention, will, no doubt, readily suggest themselves to those skilled in the art. Hence, it is desired that the foregoing description shall be considered as illustrative and not in a limiting sense.

What is claimed is:

1. A method of making passivated semiconductor devices with the aid of a wafer of semiconductor material, having a PN junction therein substantially parallel to opposed major surfaces of the wafer, and a wafer-like electrical conductive substrate, said method comprising the steps of:
fixing one of said major surfaces of said wafer to said substrate to form a combined block,
cutting a plurality of grooves in said block, each of said grooves extending through said wafer and into said substrate, whereby to form a plurality of mesas with a portion of said PN junction in each,
pressing softened glass into said grooves,
lapping said block to remove any of said glass adhering to the tops of said mesas thereby exposing said semiconductor material of the surface of each of said mesas,
metallizing said exposed surfaces of said mesas,
fixing an electrode to each of said metallized surfaces of said mesas, and
cutting through said glass transversely to said substrate, whereby to separate glass-surrounded mesas on said block from each other, each of said glass-surrounded mesas comprising one of said passivated semiconductor devices.

2. A method of making passivated semiconductor devices with the aid of a wafer of silicon and a wafer-like electrical conductive substrate of silicon, said wafer of silicon having a PN junction parallel to its opposed major surfaces, said method comprising the steps of:
coating a major surface of said wafer with a metal,
hot pressing said wafer and said substrate, a major surface of said substrate being disposed against said coated major surface of said wafer to form a block,
cutting a plurality of grooves in said block, each of said grooves extending through said wafer and into said substrate, whereby to form a plurality of mesas, each of said mesas having at least a portion of said PN junction therein,
oxidizing the surfaces of said mesas and portions of said wafer and said substrate that define said grooves to form a layer of silicon dioxide thereon,
filling said grooves with softened glass,
lapping said block to expose said surfaces of said mesas,
metallizing the exposed surfaces of said mesas,
fixing a separate electrode to each of said metallized surfaces of said mesas, and
cutting through said glass transversely to said substrate, whereby to separate said mesas from each other, each of said mesas comprising one of said passivated devices.

3. A method of making passivated rectifiers comprising the steps of:
heating and pressing together two wafers of substantially similar semiconductor material to form a block, one of said wafers having a PN junction and the other of said wafers being substantially degenerate,
cutting a plurality of grooves in said block, each of said grooves extending through said one wafer and into said other wafer, to form a plurality of mesas in said block, each of said mesas including a portion of said PN junction therein,
coating the surfaces of said mesas and those portions of said wafers that define said grooves with an electrical insulating layer,
disposing a heat-fusible insulator over said coated mesas,
heating said insulator to a softening point and applying pressure between said insulator and said block to force said heated insulator into said grooves,
lapping said block to expose said semiconductor material of said surfaces of said mesas,
applying a separate electrode to each of said surfaces of said mesas, and
cutting through said insulator to separate said mesas from each other, each of said mesas being surrounded by a sheath of said insulator and comprising one of said rectifiers.

4. A method of making passivated rectifiers comprising the steps of:
heating and pressing together two wafers of silicon to form an integral block, one of said wafers having a PN junction and the other of said wafers being substantially degenerate,
cutting a plurality of grooves in said block, each of said grooves extending through said one wafer and into said other wafer to form a plurality of mesas in said block,
coating the surfaces of said mesas and those portions of said wafers that define said grooves with silicon dioxide,
disposing glass over said mesas,
heating said glass to a softening point and applying pressure between said glass and said block to force said glass into said grooves,
lapping said block to expose said silicon of said surfaces of said mesas,
metallizing said exposed surfaces of said mesas,
applying electrodes to the metallized surfaces of said mesas, respectively, and
cutting through said glass to separate said mesas from each other, each of said mesas being surrounded by a sheath of said glass and comprising one of said rectifiers.

References Cited

UNITED STATES PATENTS

| | | | |
|---|---|---|---|
| 2,748,041 | 5/1956 | Leverenz. | |
| 2,865,082 | 12/1958 | Gates | 29—25.3 |
| 2,899,344 | 8/1959 | Atalla | 156—17 X |
| 2,981,877 | 4/1961 | Noyce. | |
| 3,076,051 | 1/1963 | Haba. | |
| 3,152,939 | 10/1964 | Borneman | 156—3 |
| 3,193,418 | 7/1965 | Cooper. | |
| 3,290,753 | 12/1966 | Chang | 29—25.3 |

OTHER REFERENCES

"Electronics Review," vol. 37, No. 17, June 1, 1964, page 23. 29—155.5 G.

IBM Tech Disc. Bull., vol. 1, No. 2, August 1958, page 25. 29—155.5.

IBM Tech Disc. Bull., vol. 3, No. 12, May 1961, pages 26 and 27. 29—155.5

WILLIAM I. BROOKS, *Primary Examiner.*